United States Patent
Huang

(10) Patent No.: US 8,460,962 B2
(45) Date of Patent: Jun. 11, 2013

(54) CAPACITIVE MEMS SWITCH AND METHOD OF FABRICATING THE SAME

(75) Inventor: Herb He Huang, Shanghai (CN)

(73) Assignee: Shanghai Lexvu Opto Microelectronics Technology Co., Ltd., Shanghai (CN)

( * ) Notice: Subject to any disclaimer, the term of this patent is extended or adjusted under 35 U.S.C. 154(b) by 319 days.

(21) Appl. No.: 12/813,832

(22) Filed: Jun. 11, 2010

(65) Prior Publication Data

US 2010/0314669 A1 Dec. 16, 2010

Related U.S. Application Data

(60) Provisional application No. 61/186,328, filed on Jun. 11, 2009.

(51) Int. Cl.
*B81C 1/00* (2006.01)
*B81B 3/00* (2006.01)

(52) U.S. Cl.
USPC ............................................. 438/52; 257/415

(58) Field of Classification Search
USPC .................. 438/142, 197, 238, 239, 253, 254, 438/48, 57, 90; 257/411, 410, 288, 213, 419
See application file for complete search history.

(56) References Cited

U.S. PATENT DOCUMENTS

| | | | |
|---|---|---|---|
| RE33,691 E | 9/1991 | Harnden, Jr. et al. | 310/332 |
| 5,629,794 A | 5/1997 | Magel et al. | 359/290 |
| 5,638,946 A | 6/1997 | Zavracky | 200/181 |
| 5,677,823 A | 10/1997 | Smith | 361/234 |
| 5,696,662 A | 12/1997 | Bauhahn | 361/298.1 |
| 6,100,477 A | 8/2000 | Randall et al. | 200/181 |
| 6,115,231 A | 9/2000 | Shirakawa | 361/233 |
| 6,143,997 A | 11/2000 | Feng et al. | 200/181 |
| 6,452,124 B1 | 9/2002 | York et al. | 200/181 |
| 2006/0181379 A1* | 8/2006 | Schwartz et al. | 335/78 |
| 2006/0223215 A1* | 10/2006 | Blanchard | 438/50 |
| 2007/0032095 A1* | 2/2007 | Ramaswamy et al. | 438/795 |
| 2007/0115965 A1* | 5/2007 | Sheu et al. | 370/389 |
| 2009/0215213 A1* | 8/2009 | Chou | 438/48 |
| 2010/0015744 A1* | 1/2010 | Kazinzci | 438/52 |

* cited by examiner

*Primary Examiner* — Olik Chaudhuri
*Assistant Examiner* — Wilner Jean Baptiste
(74) *Attorney, Agent, or Firm* — J.C. Patents

(57) ABSTRACT

The present invention discloses a capacitive MEMS switch on top of a semiconductor substrate containing a CMOS driving circuitry. The capacitive MEMS switch disclosed includes: 1) a semiconductor substrate containing a driving circuitry inside, and first and second conductors as well as a bottom electrode on top; 2) a suspended composite beam above and anchored onto the semiconductor substrate, containing a top electrode aligned to the bottom electrode with a first vertical distance, a top conductor, capped by a dielectric layer, having a first and second contact tips aligned with the first and second bottom conductors with a second vertical distance differentially smaller than the first vertical distance. The electrostatic attraction generated between the top electrode and the bottom electrode pulls the first and second contact tips in physical contact with and electrically connects the first and second bottom conductors through the top conductor.

10 Claims, 5 Drawing Sheets

CAPACITIVE MEMS SWITCH AND METHOD OF FABRICATING THE SAME

CROSS-REFERENCE TO RELATED APPLICATIONS

This application claims priority of provisional application No. 61/186,328, filed on Jun. 11, 2009, entitled "CAPACITIVE MEMS SWITCH AND METHOD OF MAKING THE SAME", which is incorporated herein by reference in its entirety.

FIELD OF THE TECHNOLOGY

The present invention relates to an MEMS switch and particularly to a capacitive MEMS switch integrated with CMOS on top of a silicon substrate and a method of fabricating the same.

BACKGROUND

Capacitive micro electrical mechanical system (MEMS) switches possess potential to compete with conventional solid-state switching devices, such as positive-intrinsic-negative (PIN) semiconductor diodes and various field effect transistors (FET). Advantages of using MEMS are both of performance and cost, potentially offering high transmission current with low transmission line loss and distortion at low fabrication and implementation costs.

Capacitive MEMS switches are micro devices whose active element is a thin conductive membrane suspended above a substrate, movable upon electrostatic force generated through the application of an electrostatic field between the substrate and the membrane. Microscopic switching of electrical signals between transmission and termination is thus achieved by physically connecting or disconnecting one or two electrical leads through contact of the deformed membrane, or its metallic tips, with the electrical leads. As the membrane is set to operate and provide means for physical switching between connection and disconnection via mechanical deformation under electrostatic force, electrical interference and thus induced cross-talk noise upon switching and transmitting electrical signal must be minimized in such microdevices (which many of the prior art fail to address effectively, for example, the disclosure by U.S. Pat. No. 6,452,124)

Micro structural behavior of the deformable membrane relative to the substrate in electrical-mechanical aspects subject to electrostatic forces and external disturbance is the first key to achieving effective and reliable performance of capacitive MEMS switches. Mechanical stiffness, toughness against fatigue and shock, and their temperature dependence and even residual stress of the deformable membrane are among many critical factors to encounter and control. The effective contact of the deformed membrane with the electrical leads is also critical to the performance of capacitive MEMS switches when electrostatically actuated. Many other factors limit such physical contact and thus its electrical characteristics including contact resistance and variation as well as thus induced signal noise. Some key aspects relate to certain material and interfacial properties of contacting conductive surfaces; surface roughening and hillocking as well as surface degradation such as oxidation are absolutely negative factors to the quality and consistency of such critical contact. Those material and surface properties become of importance when forming conductive thin films, in particular, the electrical leads and the deformable membrane as well as the contact tips using metallic thin films.

All of those factors pose stringent requirements for material selection, structural design and fabrication process of capacitive MEMS switches. Meanwhile there is also a need for designing and fabricating capacitive MEMS switches based on single crystal silicon wafer manufacturing process platforms and in particular, produced and integrated with CMOS microdevices on one silicon wafer while CMOS microdevices provide electrical control and driving to capacitive MEMS switches.

In the prior art and industrial practice to date, most of the available design and fabrication methodologies are based on bulk MEMS process platforms, which separate fabrication of MEMS from CMOS wafer process, resulting in that the capacitive MEMS switches cannot be produced and integrated with CMOS microdevices on one silicon wafer.

SUMMARY

The present invention discloses a capacitive MEMS switch on top of a silicon semiconductor substrate containing a CMOS driving circuitry. The capacitive MEMS switch disclosed includes: 1) a semiconductor substrate containing a driving circuitry inside, and first and second conductors as well as a bottom electrode on top; 2) a suspended composite beam above and anchored onto the semiconductor substrate, containing a top electrode aligned to the bottom electrode with a first vertical distance, a top conductor, capped by a dielectric layer, having a first and second contact tips aligned with the first and second bottom conductors with a second vertical distance differentially smaller than the first vertical distance. The electrostatic attraction generated between the top electrode and the bottom electrode pulls the first and second contact tips in physical contact with and electrically connects the first and second bottom conductors through the top conductor.

The metal-dielectric suspended composite beam presents a stable, controlled plate movable proximate to the semiconductor substrate, so that the contact tips are pulled from proximity to physical contact with the bottom conductors under electrostatic attraction between the top electrode and the bottom electrode by bending a first arm portion of the suspended composite beam. The contact tips in closer proximity enables their contact to the bottom conductors first while prevents further interfacial contact and thus potential stiction between the top electrode and the bottom electrode. Upon release of electrostatic contraction or compulsion between the top electrode and the bottom electrode, bending of the first arm portion is released and the suspended composite beam springs back to a load-free configuration in which the electrical connection is terminated as the contact tips are moved away from the bottom conductors.

Carbon films are used as sacrificial materials for depositing, lithographically defining and eventually suspending the suspended composite beam, including top electrodes and conductors, which enables available metallurgy including aluminum, titanium and their alloys on the silicon CMOS process platform and material selection for dielectric thin films including oxide, nitride and even carbides. This expanded metallurgy and composite thin film capability provides improved mechanical stiffness and toughness against fatigue and shock, as well as reliable contact interfaces for electrical-mechanical signal switching.

BRIEF DESCRIPTION OF THE DRAWINGS

The drawings are not necessarily to scale, emphasis instead being placed upon illustrating the framework and principles of the present invention.

DETAILED DESCRIPTION

The drawings for illustration are not necessarily to scale, emphasis instead being placed upon illustrating the framework and principles of the present invention. In the following description, reference is made to the accompanying drawings which form a part of the present specification, and which show, by way of illustration, preferred embodiments of the present invention. It is understood that other embodiments may be utilized and structural changes may be made without departing from the scope of the present invention.

Figure 1A:
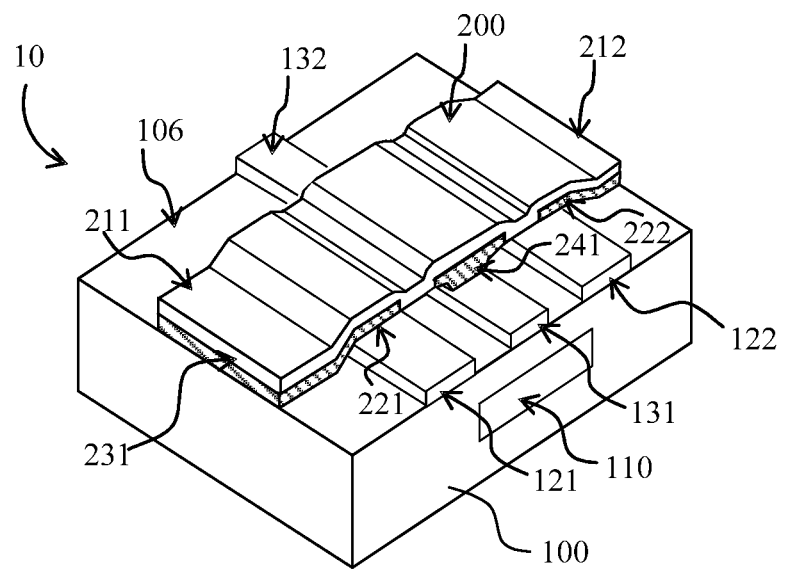
FIG. 1a is a perspective view of the capacitive MEMS switch in an embodiment of the present invention.
Figure 1B:
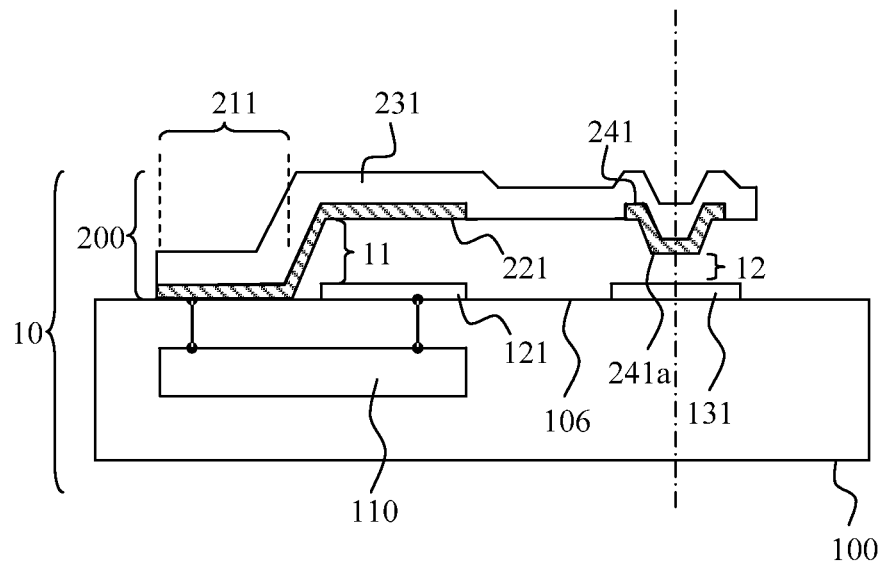
FIG. 1b is a cross sectional view of the capacitive MEMS switch in an embodiment of the present invention.

FIG. 1a is a perspective view of the capacitive MEMS switch in an embodiment of the present invention; FIG. 1b is a cross sectional view of the capacitive MEMS switch in an embodiment of the present invention. The capacitive MEMS switch 10 includes a semiconductor substrate 100 and a suspended composite beam 200 in which a portion of the suspended composite beam 200 is suspended above the semiconductor substrate 100. First of all, the semiconductor substrate 100 contains a driving circuitry 110 underneath a top surface 106 which is readily produced before fabricating the suspended composite beam 200. The semiconductor substrate 100 may be made from any or combination of silicon, germanium, gallium and arsenic. Alternatively, the semiconductor substrate 100 may be a single crystal silicon wafer and the driving circuitry 110 may be formed by complementary metal oxide semiconductor (CMOS) devices. In addition, the semiconductor substrate 100 further includes a first bottom electrode 121, a first bottom conductor 131 and a second bottom conductor 132 fabricated on the top surface 106. One of the first bottom conductor 131 and the second bottom conductor 132 serves as the inlet of electrical signal to be bridged in connection or disconnection while the other as the outlet.

The suspended composite beam 200 is anchored to the top surface 106 of the semiconductor substrate 100 via a first arm portion 211. The suspended composite beam 200 includes a first top electrode 221 vertically aligned and overlapped in suspension with the first bottom electrode 121 on the semiconductor substrate 100, forming an electrostatic capacitor for generating electrostatic contraction or compulsion by polarized electrical charges. Alternatively, as shown in FIG. 1a, the suspended composite beam 200 may further comprise a second arm portion 212 and a second top electrode 222 in symmetry with the first arm portion 211 and the first top electrode 221 respectively. The second top electrode 222 is vertically aligned to and configured in the first vertical distance 11 from the second bottom electrode 122 so as to form another electrostatic capacitor between the second top electrode 222 and the second bottom electrode 122. The suspended composite beam 200 may be further anchored on top of the semiconductor substrate 100 via the second arm portion 212 and electrically connected to the driving circuitry 110 through the second arm portion 212 for enhancing the electrical mechanical performance of the capacitive MEMS switch 10.

Figure 2A:
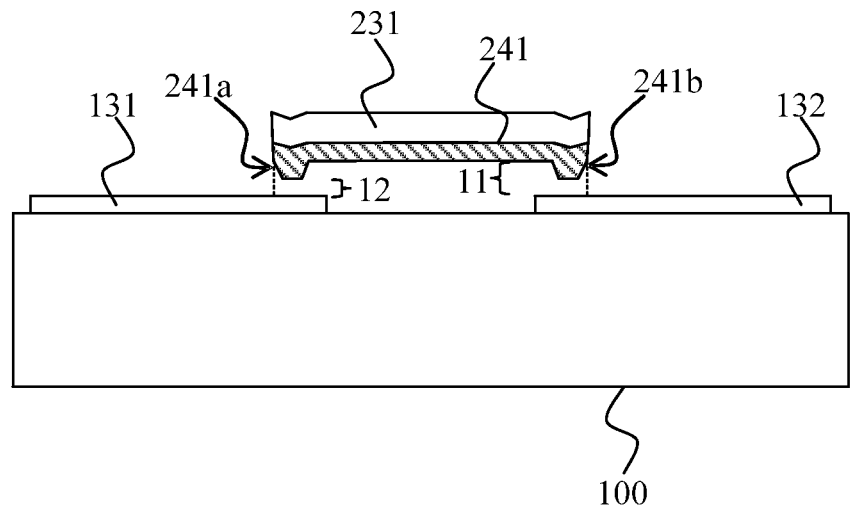
FIGS. 2a and 2b are cross sectional views of two alternative configurations of electrical mechanical contact switching in the capacitive MEMS switch.
Figure 2B:
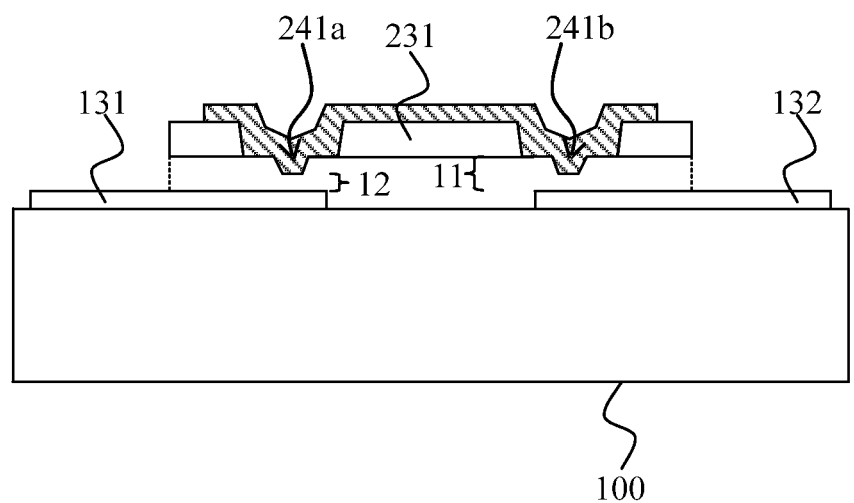

FIGS. 2a and 2b are cross sectional views of two alternative configurations of electrical mechanical contact switching in the capacitive MEMS switch 10. As shown in the figures, the suspended composite beam 200 further includes a top conductor 241 containing a first contact tip 241a vertically aligned to the first bottom conductor 131 and a second contact tip 241b vertically aligned to the second bottom conductor 132.

Alternatively, the first bottom electrode 121 and the second bottom electrode 122 as well as the first bottom conductor 131 and the second bottom conductor 132 may be made from identical conductive thin film materials in the same film stack, and in particularly, from available thin film metallurgical materials commonly used in silicon wafer fabrication process, including but not limited to: aluminum, titanium, tantalum, copper, cobalt, nickel, platinum, tungsten, and their alloys. And the same is applicable to the first top electrode 221 and the second top electrode 222 as well as the top conductor 241.

The suspended composite beam 200 further includes a dielectric layer 231 for enhancing mechanical aspects of the suspended microstructure in composition of at least two layers of different thin film materials as well as electrical isolation between the electrodes and conductors. The dielectric layer 231 may be a dielectric layer film 230 made from available dielectric thin film materials including but not limited to: silicon oxide, silicon nitride, silicon oxynitride, silicon carbide, aluminum oxide, aluminum nitride, titanium oxide and titanium nitride, tantalum oxide and tantalum nitride. Such composite thin film microstructure in the composition of an inorganic compound thin film with a metal thin film substantially enhances the mechanical aspects of the suspended composite beam 200, including stiffness and toughness against fatigue and shock. Such composition also offers means for balancing the thermal expansion mismatch and residual stresses among different films.

The first contact tip 241a and the first bottom conductor 131 are statically spaced in a second vertical distance 12; the second contact tip 241b and the second bottom conductor 132 are also statically spaced in a second vertical distance 12. A bottom surface of the main body of the top conductor 241 except the first contact tip 241a and the second contact tip 241b are statically spaced in a first vertical distance 11. The second vertical distance 12 is differentially smaller than a first vertical distance 11. The first bottom electrode 121 and the pairing first top electrode 221 are also spaced statically in the first vertical distance 11. As opposite electrical charge applied to the first bottom electrode 121 and the pairing first top electrode 221, electrostatic contractive force is generated bending first arm portion 211 and pulling the suspended portion of the suspended composite beam 10 towards the top surface 106 of the semiconductor substrate 100. The first contact tip 241a and the second contact tip 241b are brought respectively in physical contact with and thus bridge the first bottom conductor 131 and the second bottom conductor 132 so as to turn the capacitive MEMS switch 10 on. Upon release of the opposite electrical charge, the suspended composite beam 200 springs back to its static equilibrium configuration and thus, the first contact tip 241a and the second contact tip 241b are respectively brought away from the first bottom conductor 131 and the second bottom conductor 132 so as to turn the capacitive MEMS switch 10 off.

In the configuration shown in FIG. 2a, the whole top conductor 241 is placed underneath the dielectric layer 231. Specifically, as shown in FIG. 3e, the dielectric layer 231 is configured above both the first top electrode 221 and the top conductor 241.

In the alternative configuration shown in FIG. 2b, main portion of the top conductor 241 is produced on top of the dielectric layer 231 with its two ends including the first contact tip 241a and the second contact tip 241b forged into the etch holes in the dielectric layer 231. This provides improved electrical isolation of the top conductor 241 with the first bottom conductor 131 and second bottom conductor 132. Specifically, as shown in FIG. 4c, the dielectric layer 231 is configured above the first top electrode 221 but beneath the top conductor 241.

The capacitive MEMS switch in the present embodiment has an effective and reliable micro electrical mechanical structural design which can be compatible with CMOS wafer process so that it can be produced and integrated with CMOS microdevices on one silicon wafer, and it utilizes available solid-state film material and fabrication process so as to meet the requirement of low-cost and high-efficiency CMOS integrity and MEMS.

Figure 3A:
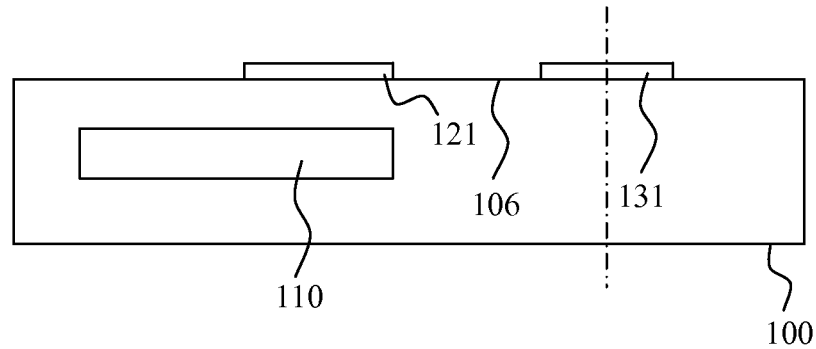
FIGS. 3a, 3b, 3c, 3d, 3e and 3f are a sequence of cross-sectional views illustrating sequential processing steps for fabricating the capacitive MEMS switch in an embodiment of the present invention.
Figure 3B:
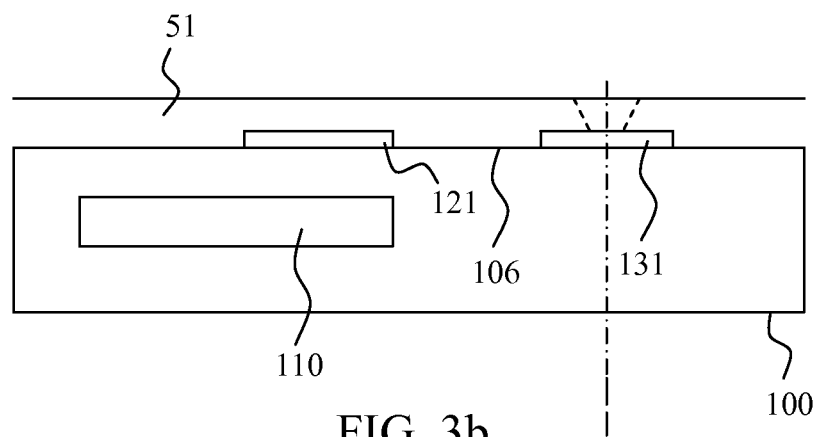
Figure 3C:
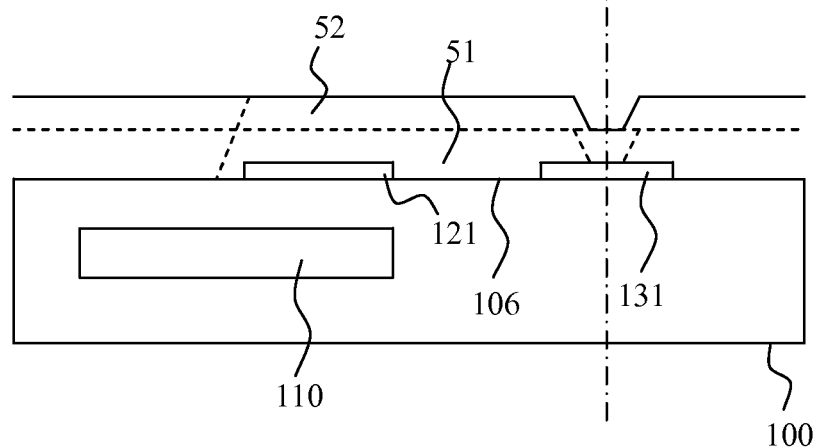
Figure 3D:
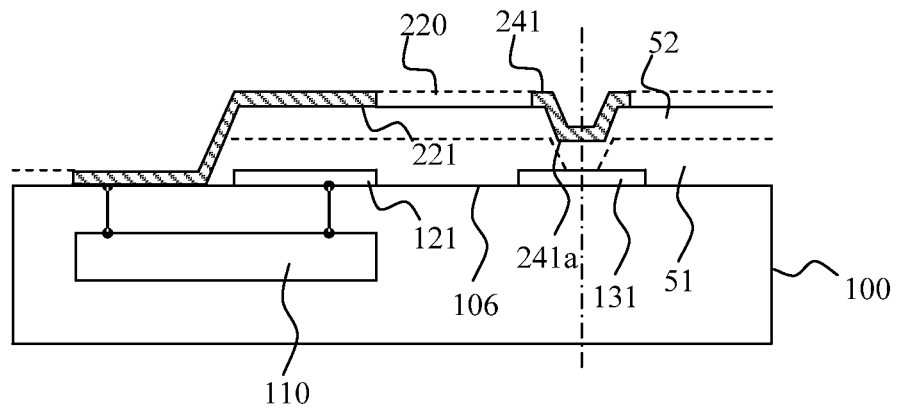
Figure 3E:
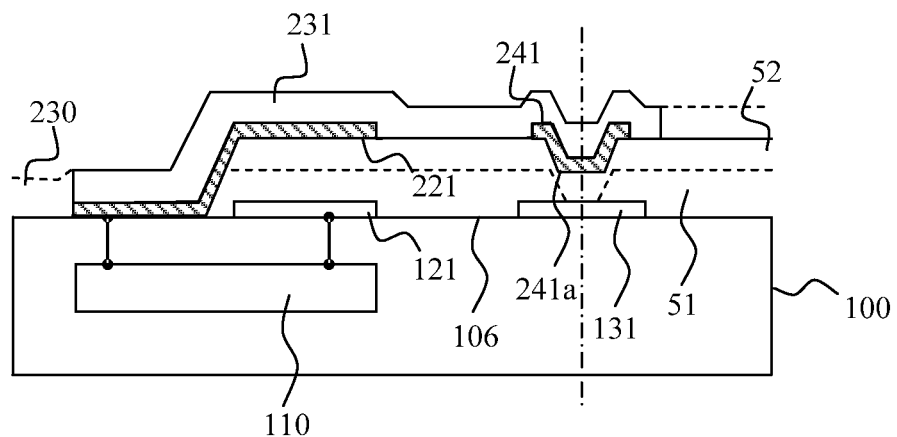

FIGS. 3a, 3b, 3c, 3d, 3e and 3f are a sequence of cross-sectional views illustrating sequential processing steps for fabricating the capacitive MEMS switch 10 in an embodiment of the present invention. Upon provision of the semiconductor substrate 100, the driving circuitry 110 is readily fabricated first. Later the first bottom electrode 121 and the optional second bottom electrode 122 (not shown) are fabricated through thin film deposition and lithographical patterning processes together with the first bottom conductor 131 and the second bottom conductor 132, as shown in FIG. 3a.

A first sacrificial film 51 is deposited onto the semiconductor substrate 100, covering the first bottom electrode 121 (and the optional second bottom electrode 122) as well as the first bottom conductor 131 and the second bottom conductor 132. Then the first sacrificial film 51 is lithographically patterned and etched to form etch holes onto part of the first bottom conductor 131 and the second bottom conductor 132, where the first contact tip 241a and the second contact tip 241b to be formed, as shown in FIG. 3b.

Topping the remaining first sacrificial film 51 and the exposed portion of the first bottom conductor 131 and the second bottom conductor 132, a second sacrificial film 52 is deposited and the composite film including the first sacrificial film 51 and the second sacrificial film 52 is lithographically patterned to etch open portion unto the semiconductor substrate 100 for anchoring the suspended composite beam 200 to be formed, as shown in FIG. 3c.

Both the first sacrificial film 51 and the second sacrificial film 52 may be carbon films and may be deposited through available carbon deposition wafer processing steps, including: 1) placing the semiconductor substrate 100 in a reactor chamber; 2) introducing a carbon-containing process gas into the reactor chamber and introducing a layer-enhancing additive gas that enhances thermal properties of the carbon film; 3) generating a reentrant toroidal RF plasma current in a reentrant path that includes a process zone overlying the substrate by coupling a plasma RF source power to an external portion of the reentrant path; and 4) coupling RF plasma bias power or bias voltage to the semiconductor substrate.

A top electrode film 220 is deposited on top of the patterned composite film including the first sacrificial film 51 and the second sacrificial film 52 and lithographically patterned to form the first top electrode 221 (and the optional second top electrode 222 in the symmetric configuration) as well as the top conductor 241 with the first contact tip 241a and the second contact tip 241b produced simultaneously into the pre-etched hole of the composite films 51 and 52. While the first top electrode 221 (and the second top electrode 222) is placed in a first vertical distance 11 from the first bottom electrode 121 (from the second bottom electrode 122, respectively), the first contact tip 241a is configured in a second vertical distance 12 from the first bottom conductor 131, and the second contact tip 241b is configured in a second vertical distance 12 from the second bottom conductor 132. The second vertical distance 52 is differentially smaller than the first vertical distance 51, as shown in FIG. 3d.

Then, a dielectric layer 231 is deposited and lithographically patterned to form the suspended composite beam 200 still on top the composite film including the first sacrificial film 51 and the second sacrificial film 52, as shown in FIG. 3e.

Figure 3F:
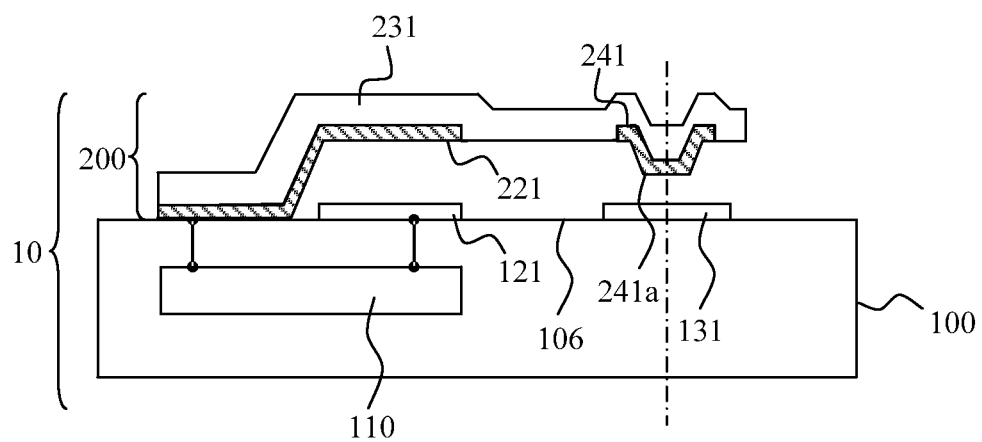

Finally, the remaining composite film are selectively removed and thus the suspended composite beam 200 is fully released such that the capacitive MEMS switch 10 including the configuration in FIG. 2a is completely constructed as shown in FIG. 3f. The first sacrificial film 51 and the second sacrificial film 52 may be removed by selective etch process gas of oxygen or nitrogen in a reactor chamber containing plasma generated with a plasma source power.

Figure 4A:
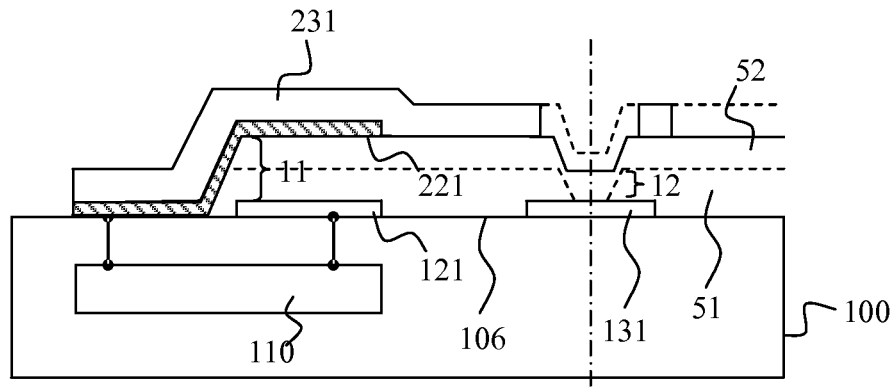
FIGS. 4a, 4b and 4c are a sequence of cross-sectional views illustrating sequential processing steps for fabricating the capacitive MEMS switch in another embodiment of the present invention.
Figure 4B:
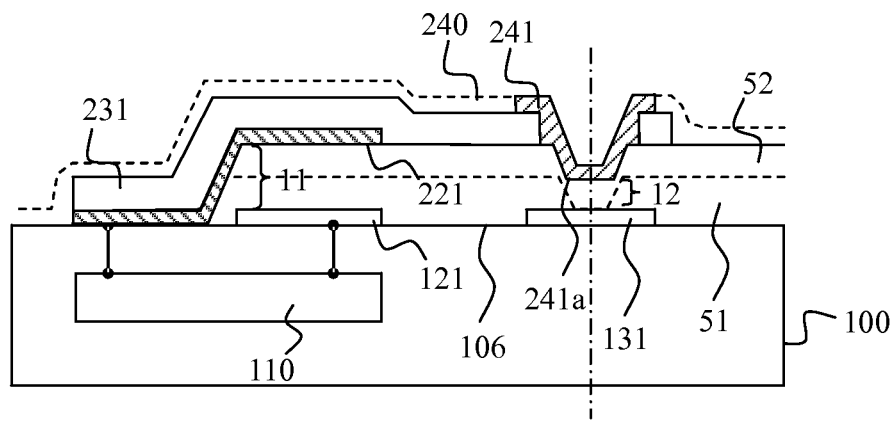
Figure 4C:
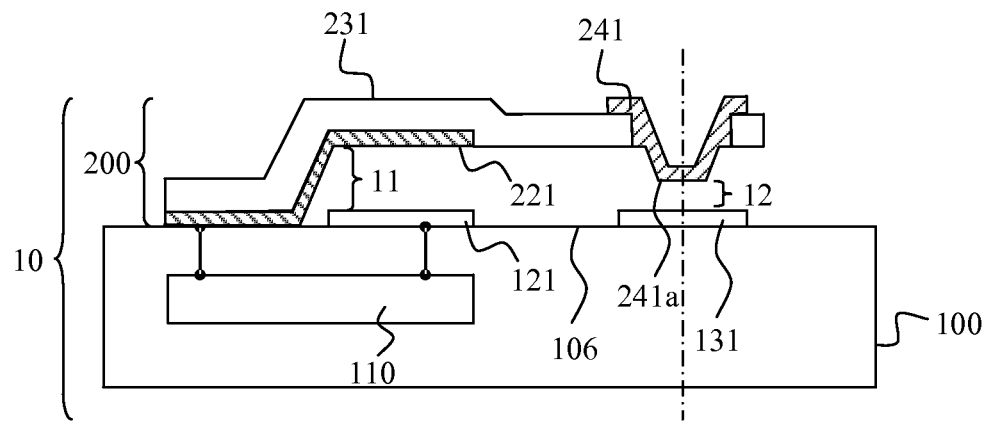

FIGS. 4a, 4b and 4c are a sequence of cross-sectional views illustrating sequential processing steps for fabricating the capacitive MEMS switch 10 in another embodiment of the present invention. Alternatively after forming the open portion as shown in FIG. 3c, a dielectric layer 231 is deposited on top of the composite film and etch holes through the dielectric layer 231 are also produced for later forming the first contact tip 241a and the second contact tip 241b when lithographically patterning the dielectric layer 231 shown in FIG. 4a. Then the top conductor layer 240 is deposited and lithographically patterned for forming the top conductor 241 and the suspended composite beam 200. The top conductor 241 includes the first contact tip 241a and the second contact tip 241b configured in the second vertical distance 12 from the first bottom conductor 131 and the second bottom conductor 132 respectively as shown in FIG. 4b. And eventually, the remaining composite film is selectively removed and thus the suspended composite beam 200 is fully released such that the capacitive MEMS switch 10 including the configuration in FIG. 2b is completely constructed as shown in FIG. 4c.

It should be obvious that the relative planar position of the top conductor 241 is not fixed as shown in the above figures, with its first contact tip 241a and the second contact tip 241b to the first top electrode 221 and the second top electrode 222 as well as the first arm portion 211 and the second arm portion 212. In line with the principles claimed in this disclosure, the top conductor 241 is alternatively configured closer to the first arm portion 211 than the first top electrode 221, interchanged in relative positions to what is shown in FIG. 1b The method of fabricating the capacitive MEMS switch in the present embodiment realizes an effective and reliable micro electrical mechanical structural design which can be compatible with CMOS wafer process so that it can be produced and integrated with CMOS microdevices on one silicon wafer, and it utilizes available solid-state film material and fabrication process so as to meet the requirement of low-cost and high-efficiency CMOS integrity and MEMS.

Finally, it should be understood that the above embodiments are only used to explain, but not to limit the technical solution of the present invention. In despite of the detailed description of the present invention with referring to above preferred embodiments, it should be understood that various modifications, changes or equivalent replacements can be made by those skilled in the art without departing from the scope of the present invention and covered in the claims of the present invention.

What is claimed is:

1. A method of fabricating a capacitive MEMS switch, comprising:

forming a driving circuitry on a semiconductor substrate;

forming a first bottom electrode, a first bottom conductor and a second bottom conductor on top of the semiconductor substrate by lithographically patterning;

depositing a first sacrificial film onto the semiconductor substrate wherein the first sacrificial film covers the first bottom electrode, the first bottom conductor and the second bottom conductor;

lithographically patterning and etching the first sacrificial film to form etch holes onto part of the first bottom conductor and the second bottom conductor;

depositing a second sacrificial film topping the remaining first sacrificial film and the exposed portion of the first bottom conductor and the second bottom conductor;

lithographically patterning a composite film comprising the first sacrificial film and the second sacrificial film to etch an open portion unto the semiconductor substrate for anchoring a suspended composite beam;

depositing a top electrode film directly on the composite film and into the open portion so as to directly contact the semiconductor substrate, and lithographically patterning the top electrode film to form a first top electrode and a top conductor having a first contact tip and a second contact tip positioned corresponding to the etch holes onto part of the first bottom conductor and the second bottom conductor, respectively;

depositing a dielectric layer on top of the first top electrode, the top conductor, and the composite film and lithographically patterning the dielectric layer to form the suspended composite beam;

selectively removing the remaining composite film so that a bottom surface of the first top electrode directly faces an upper surface of the first bottom electrode.

2. The method according to claim 1, wherein at the same time when depositing the top electrode film on top of the composite film and lithographically patterning the top electrode film to form the first top electrode and the top conductor, a second top electrode in symmetry with the first top electrode is formed.

3. The method according to claim 1, wherein the first sacrificial film and the second sacrificial film are carbon films.

4. The method according to claim 3, wherein the first sacrificial film and the second sacrificial film are removed by selective etch process gas of oxygen or nitrogen in a reactor chamber containing plasma generated with a plasma source power.

5. The method according to claim 3, wherein the first sacrificial film and the second sacrificial film are deposited by means of:

placing the semiconductor substrate in a reactor chamber;

introducing a carbon-containing process gas into the reactor chamber and introducing a layer-enhancing additive gas that enhances thermal properties of the first sacrificial film and the second sacrificial film;

generating a reentrant toroidal RF plasma current in a reentrant path that includes a process zone overlying the substrate by coupling a plasma RF source power to an external portion of the reentrant path; and coupling RF plasma bias power or bias voltage to the semiconductor substrate.

6. A method of fabricating a capacitive MEMS switch, comprising:

forming a driving circuitry on a semiconductor substrate;

forming a first bottom electrode, a first bottom conductor and a second bottom conductor on top of the semiconductor substrate by lithographically patterning;

depositing a first sacrificial film onto the semiconductor substrate wherein the first sacrificial film covers the first bottom electrode, the first bottom conductor and the second bottom conductor;

lithographically patterning and etching the first sacrificial film to form first etch holes onto part of the first bottom conductor and the second bottom conductor;

depositing a second sacrificial film topping the remaining first sacrificial film and the exposed portion of the first bottom conductor and the second bottom conductor;

lithographically patterning a composite film comprising the first sacrificial film and the second sacrificial film to etch an open portion unto the semiconductor substrate for anchoring a suspended composite beam;

depositing a top electrode film directly on the composite film and lithographically patterning the top electrode film to form a first top electrode;

depositing a dielectric layer on top of the first top electrode, the composite film and producing second etch holes through the dielectric layer, positioned corresponding to the first etch holes onto part of the first bottom conductor and the second bottom conductor, respectively;

depositing a top conductor layer on the dielectric layer and into the etch holes, and lithographically patterning the top conductor layer to form the suspended composite beam and a top conductor having a first contact tip and a second contact tip, wherein the dielectric layer is above the first top electrode but beneath the top conductor;

selectively removing the remaining composite film so that a bottom surface of the first top electrode directly faces an upper surface of the first bottom electrode.

7. The method according to claim 6, wherein at the same time when depositing the top electrode film on top of the composite film and lithographically patterning the top electrode film to form the first top electrode and the top conductor, a second top electrode in symmetry with the first top electrode is formed.

8. The method according to claim 6, wherein the first sacrificial film and the second sacrificial film are carbon films.

9. The method according to claim 8, wherein the first sacrificial film and the second sacrificial film are deposited by means of:

placing the semiconductor substrate in a reactor chamber;

introducing a carbon-containing process gas into the reactor chamber and introducing a layer-enhancing additive gas that enhances thermal properties of the first sacrificial film and the second sacrificial film;

generating a reentrant toroidal RF plasma current in a reentrant path that includes a process zone overlying the substrate by coupling a plasma RF source power to an external portion of the reentrant path; and coupling RF plasma bias power or bias voltage to the semiconductor substrate.

10. The method according to claim 8, wherein the first sacrificial film and the second sacrificial film are removed by selective etch process gas of oxygen or nitrogen in a reactor chamber containing plasma generated with a plasma source power.

* * * * *